United States Patent [19]
Alexander et al.

[11] Patent Number: 5,604,701
[45] Date of Patent: Feb. 18, 1997

[54] INITIALIZING A READ PIPELINE OF A NON-VOLATILE SEQUENTIAL MEMORY DEVICE

[75] Inventors: Samuel E. Alexander, Phoenix; Kent D. Hewitt, Gilbert, both of Ariz.

[73] Assignee: Microchip Technology Incorporated, Chandler, Ariz.

[21] Appl. No.: 508,331

[22] Filed: Jul. 27, 1995

[51] Int. Cl.⁶ .................................................. G11C 7/00
[52] U.S. Cl. ........................ 365/189.02; 365/189.05
[58] Field of Search ....................... 365/189.02, 189.05, 365/205, 221, 230.02; 395/494, 496

[56] References Cited

U.S. PATENT DOCUMENTS

| | | | |
|---|---|---|---|
| 4,817,054 | 3/1989 | Banerjee | 365/189.02 |
| 4,954,987 | 9/1990 | Auvinen | 365/189.02 |
| 5,262,990 | 11/1993 | Mills | 365/189.02 |

*Primary Examiner*—David C. Nelms
*Assistant Examiner*—Son Mai
*Attorney, Agent, or Firm*—Wigman, Cohen, Leitner & Myers, P.C.

[57] ABSTRACT

A sequential memory device having a read pipeline data structure for reading data from a bitline of a memory array of the device is disclosed. The read pipeline data structure includes at least one data path including a sense amp for sensing the logic level appearing on the bitline, a flip-flop for providing an output signal indicative of the data bits received on the bitline, and means for initializing the data path upon power up of the device such that the first data bit from the memory array is available for output from the device without the need and before the occurrence of a clock signal.

12 Claims, 3 Drawing Sheets

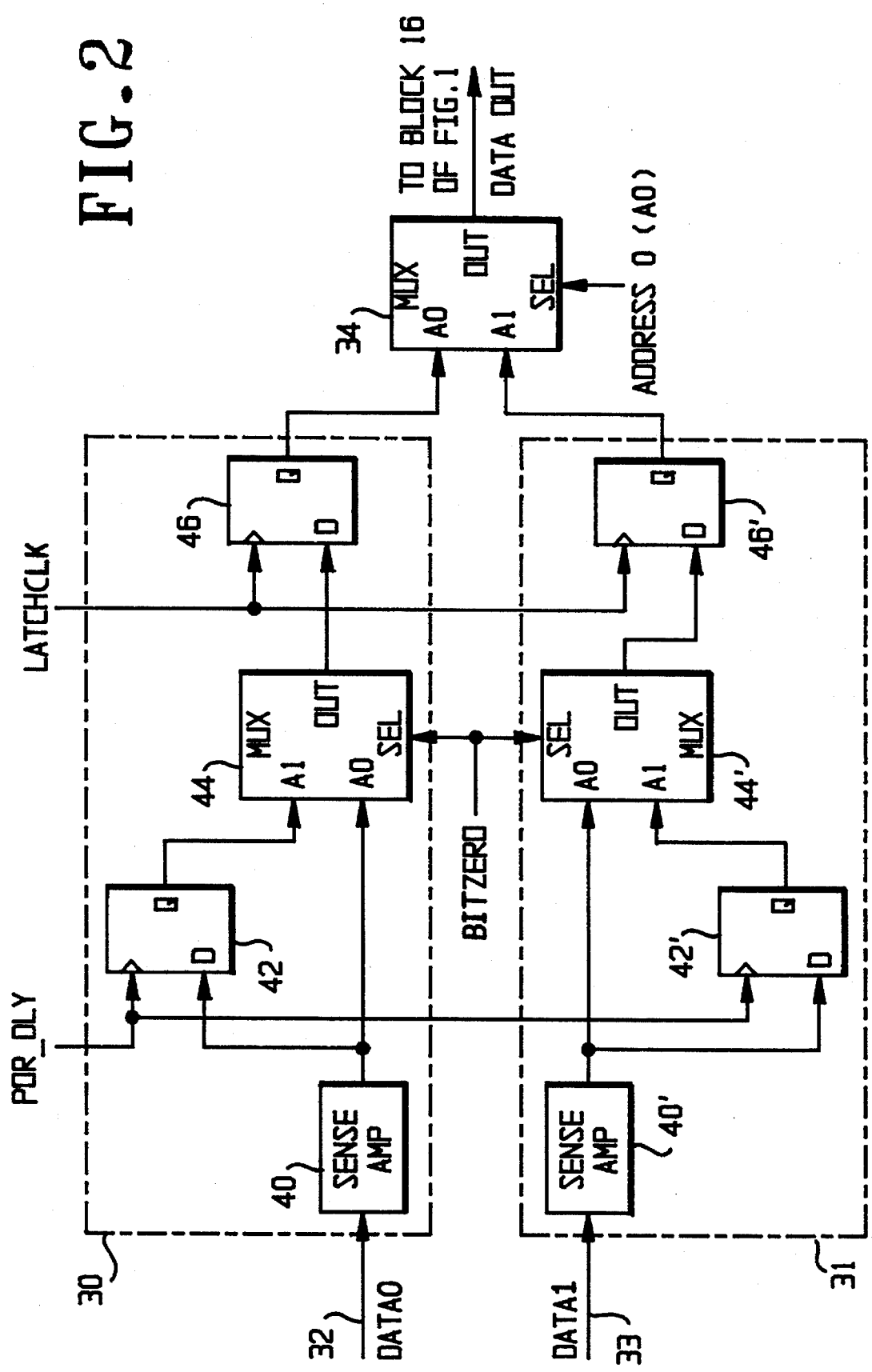

INITIALIZING A READ PIPELINE OF A NON-VOLATILE SEQUENTIAL MEMORY DEVICE

BACKGROUND OF THE INVENTION

This invention relates to non-volatile memory devices and, in particular, to initializing a read pipeline of a non-volatile sequential memory device with data from the memory array by sensing and storing the first two data bits in the first two memory locations of the device upon power-on and outputting the first data bit upon selection of the device and before the occurrence of a clock signal.

Memory devices are used in a number of different applications for storing data that is written into the memory array of the device. The stored data may then be accessed by an external device, such as a microcontroller, by reading the contents of the memory device wherein the contents of the memory device may contain the program code to control the operation of the microcontroller.

A non-volatile memory device is a device that is able to retain the data stored therein even when no power is applied to the device, as opposed to volatile memory devices whose contents are lost when power is removed. Common non-volatile memories include electrically programmable read-only memories (EPROMs) and electrically erasable programmable read-only memories (EEPROMs).

Sequential memory devices are memory devices that have the capability to output the contents stored at an address pointed to by an address counter in a sequential fashion. The address counter of the device is sequentially incremented in response to a received clock signal thereby allowing the entire contents of the memory array to be read out in a sequential fashion. A sequential memory device is unlike a random access memory (RAM) device because the address pointer of the sequential device cannot be written to, i.e., one cannot set the address pointer to any desired address to access data thereat, as in RAM devices. However, the address counter of a sequential memory device can be reset to the address of the first data location in response to a received reset signal.

Memory devices include a read data path for outputting its stored data in response to a read command. In a read pipeline structure, the read data path typically includes a sense amplifier and a D flip-flop. The D flip-flop is required for storing the data currently being output on the data output pin of the memory device, while the sense amp is reading the next bit to be output. Briefly, each sense amplifier is coupled to a bitline for serially receiving data bits from the memory array. The sense amplifier detects the voltage level appearing on the bitline and provides a corresponding logic voltage level to the data input of the D flip-flop indicative of the logic value of the bitline voltage. The stored value in the D flip-flop is finally outputted from the memory device upon a subsequent transition of the received clock signal.

However, such a read pipeline data structure suffers from the drawback that it takes at least three transitions of the received clock signal to output the first data bit: a first transition to begin pre-charging the bitline to a logic "1" state, a second transition to release the pre-charge and allow the memory cell to control the bitline voltage so that the data stored in the memory cell can be read by the sense amplifier, and a third transition to clock the D flip-flop and output the first data bit. Such a three clock delay cannot be tolerated when the memory device is required to start outputting data only a short time after being powered-up or selected.

It is therefore a principal object of the present invention to provide a circuit and method for initializing a read data path of a non-volatile sequential serial memory device with data from the memory array by sensing the first two data bits stored in the first two memory locations of the memory device upon power-on and outputting the first data bit from the memory device upon selection of the device and before the occurrence of a clock signal.

It is also an object of the present invention to provide a circuit and method for sensing the first two data bits of a serial memory device and storing these data bits in latches upon device power-up.

SUMMARY OF THE INVENTION

A sequential memory device having a read pipeline data structure is provided that is initialized immediately upon device power-on by reading data from selected memory cells within the memory array of the device upon power-up and outputting the first data bit upon the selection of the device and without the need for a clock signal. Although only one data path or a plurality of data paths could be used, the read pipeline data structure of the preferred embodiment includes two parallel data paths coupled to respective bit-lines for simultaneously sensing two data bits from memory array. The read pipeline data structure is initialized such that the first two data bits of the memory array are sensed and stored upon device power-on such that upon selection of the device the first data bit is outputted without the occurrence or need of a received clock signal.

In particular, the read pipeline data structure is initialized in the following manner. Upon the assertion of power, a power-on reset signal is generated and the voltages appearing on selected bitlines pre-charge to a high voltage level. After the power on reset signal goes low, but while a delayed power on reset signal is still asserted, the pre-charge turns off, the selected memory cells now control the voltage appearing on the bitlines and the sense amps within each data path sense the voltage levels appearing on the bitlines. Upon the transition of a delayed power-on reset signal, the outputs of the sense amps are latched into D flip-flops included in each data path thereby storing these first two data bits upon device power-up.

Upon the assertion of a chip enable signal and selection of the memory device, the first data bit (bit 0) is output from the device. Note, however, that if the chip enable signal is asserted during power up, the first data bit will be output when the delayed power-on reset signal returns low. Thus, the first data bit is outputted from the device upon selection of the device, or when the delayed power-on rest signal is not asserted, and without the need for a clock signal. Also, at this time, the bitlines begin to pre-charge based upon the logic values of the next two data bits (bits 2 and 3) of the memory array.

Thereafter and upon the first low to high logic transition of the received clock signal, the second data bit (bit 1) is output from the device. Thus, during the first cycle of the received clock signal, the present invention has already outputted the first two data bits from the device. Also, at this time, the sensing of bits 2 and 3 is begun.

Thereafter, additional data bits sensed in each data path are selectively and alternately outputted from the device on the rising transition of the received clock signal and according to the logic value of the lowest address bit of the address counter.

The present invention also provides a circuit for generating a power-on reset signal and a delayed power-on reset signal utilizing similar transistors as those used in the memory cells of the array so that the power supply voltage at the end of the power-on reset is sufficient to sense the memory cell and the delayed power-on reset signal remains asserted for a sufficient length of time after the power-on reset signal goes low to allow the sense amps to pull the bitlines low (if needed) and adequately sense the logic values of the first two data bits.

BRIEF DESCRIPTION OF THE DRAWINGS

The present invention will be better understood with a detailed description taken in conjunction with the accompanying drawings in which:

FIG. 2 is a detailed block diagram illustrating a two-bit wide read pipeline data structure for outputting data from the sequential memory device upon power-up and before the occurrence of a clock signal;

DETAILED DESCRIPTION OF THE PREFERRED EMBODIMENT

Figure 1:
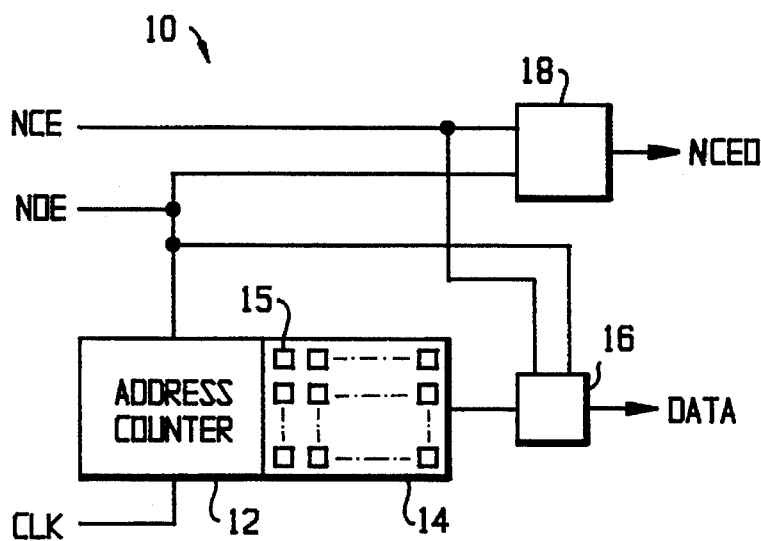
FIG. 1 is a simplified block diagram depicting a non-volatile sequential memory device.

Referring to FIG. 1, a simplified block diagram depicting a non-volatile sequential memory device 10 is shown. In a preferred embodiment, memory device 10 takes the form of a sequential serial EPROM device having part number 37LV36/65/128 manufactured by Microchip Technology Incorporated using CMOS-EPROM technology. However, the read pipeline data structure described presently may be used in sequential parallel memory devices, and memory devices using other non-volatile technologies such as EEPROM. Moreover, the present invention generally applies to non-volatile memories since data stored in the device must be maintained even when power is not applied to the device so that such data can be read upon power-on as will be described presently.

The memory device 10 includes memory array 14 having a plurality of memory cells 15 arranged in row/column format wherein each memory cell corresponds to a unique address of the array. The device further includes internal address counter 12 coupled to memory array 14 for accessing data stored in the memory address of the cell contained in address counter 12.

Device 10 also includes logic block 16 responsive to logic signals not chip enable, NCE, and not output enable, NOE, for enabling output data from memory array 14 to be outputted from the device. Legic signal NCE is an active low signal that is asserted when memory device 10 is selected, and logic signal NOE is also an active low signal that is asserted when the output buffers of device 10 are enabled. Device 10 also includes logic block 18 responsive to logic signals NCE and NOE for providing a not chip enable out signal, NCEO, which is an active low output signal that is asserted on the clock cycle following the last bit read from the memory device.

Briefly, the rising edge of the clock signal (CLK) shifts data in or out of the memory device one bit at a time while the clock signal is used to increment the internal address counter for reading and programming operation. In the programming mode, the rising edge of the clock signal shifts a data bit into the memory device when both the NCE and NOE logic signals are high. In the read mode, the rising edge of the clock signal shifts a data bit out of the memory device when both the NCE and NOE logic signals are low. Moreover, the address counter is incremented on the rising edge of the clock signal at the same time data is shifted out of the device thereby allowing the device to read the next data bit at the next subsequent memory address.

Referring now to FIG. 2, the two-bit wide read pipeline data path of memory device 10 of FIG. 1 is shown. The two-bit wide data path allows device 10 to simultaneously sense two data bits from selected memory cells within the memory. In accordance with a principle aspect of the present invention, the data paths have the capability of sensing and storing the first two data bits upon device power-up, and outputting the first data bit from the device in response to a chip enable signal and before the occurrence or need of a clock signal. Note, however, that if the device is selected before being taken out of the reset, the first data bit is outputted in response to a delayed power-on reset signal becoming non-asserted.

The read data path includes two parallel data paths, 30 and 31, for pre-charging and sensing two data bits at a time. It is understood, however, that the read data structure of the present invention may include only one data path for sensing one bit at a time, or a plurality of data paths for sensing a plurality of data bits at a time. Multiplexer 34 has inputs coupled to the outputs of the two read data paths for alternately and selectively providing data from each data path to the output of the memory array as represented by signal DATAOUT. Signal DATAOUT is supplied to logic block 16 (of FIG. 1) wherein signal DATAOUT is transferred to the output of the memory device when the output buffers of logic block 16 are enabled.

Read data paths 30 and 31 are respectively coupled to first and second bitlines 32 and 33 for receiving data bit signals DATA0 and DATA1 from selected memory cells within memory array 14. Referring particularly to read data path 30, sense amp 40 is included for sensing and detecting the logic state of the data bit on bitline 32 wherein, for CMOS EPROM technology, a voltage level less than 0.4 volts is indicative of a logic low or logic "0", while a voltage level greater than 1.0 volts is indicative of a logic high or logic "1". Briefly, bitline 32 is charged to a logic high voltage during the precharge cycle. During the sense cycle, a small pull-up device, such as a transistor, maintains the bitline at the logic high voltage level unless the selected memory cell has been erased in which case the memory cell overcomes the small device and pulls the bitline to a logic low voltage level.

In either case, the voltage representing the sensed and detected logic state is provided to both the data input of D flip-flop 42 and to the first input (A0) of multiplexer The output of D flip-flop 42 is coupled to the second input (A1) of multiplexer 44, the output of the latter being supplied to data input of D flip-flop 46. The select line of multiplexer 44 is coupled to receive logic signal BITZERO wherein signal BITZERO a logic high whenever the address counter is equal to address zero (the address location of the first data bit, i.e., $A_N$–$A_0$="0") and not chip enable signal NCE is high. The clock input of D flip-flop 42 is coupled to receive a delayed power-on reset signal (POR_DLY) while the clock input of D flip-flop 46 is coupled to receive an internal clock signal LATCHCLK. Signal LATCHCLK is essentially signal CLK divided by two and enabled by logic signal NCE.

Read data path 31 is identical to read data path 30 with the exception that read data path 31 is coupled to a bitline 33 for receiving a second data bit signal as represented by DATA1. Accordingly, corresponding components within read data path 31 that are identical to components of read data path 30 are identified by prime (') reference numbers.

Figure 3:
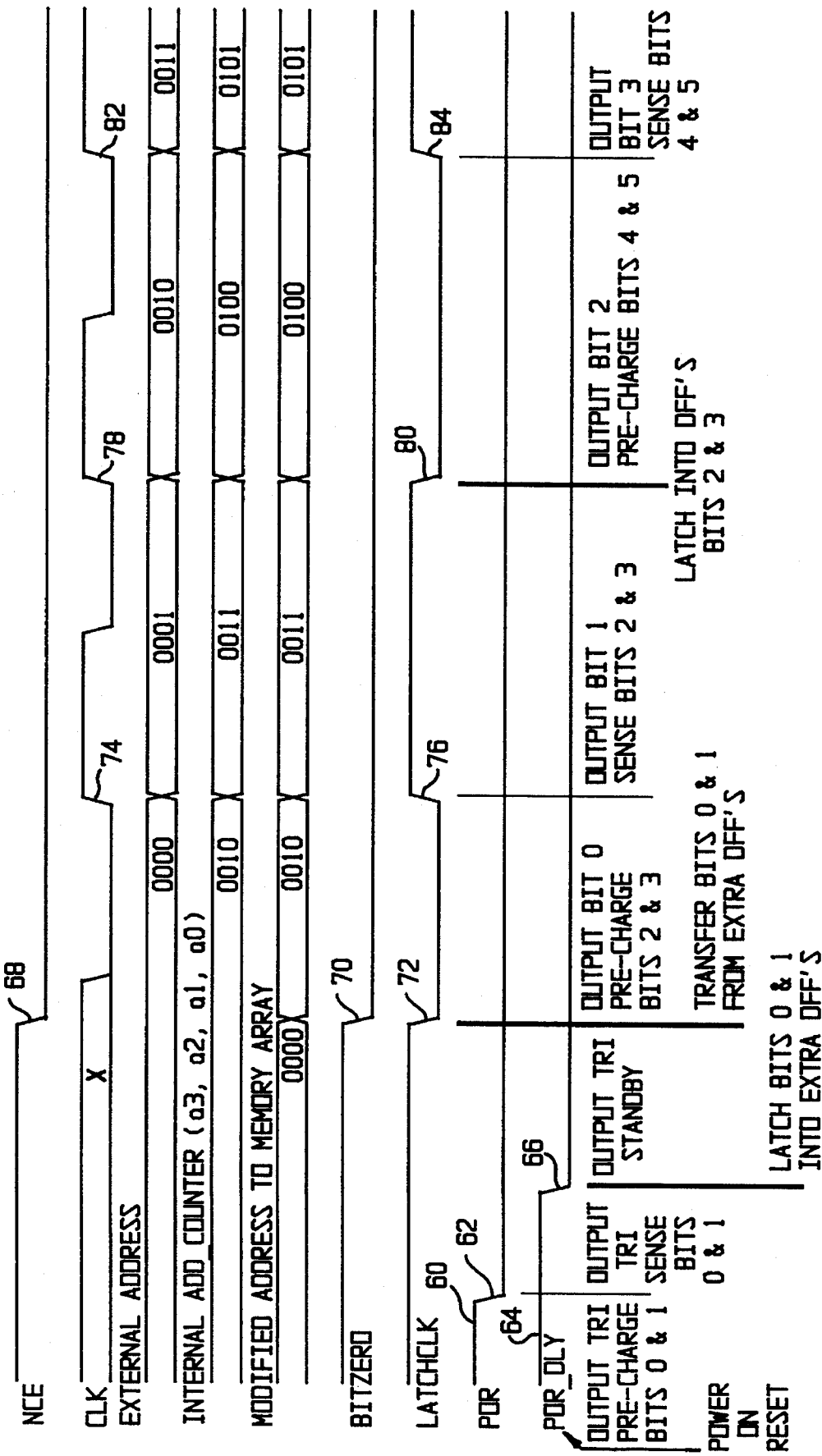
FIG. 3 is a detailed timing diagram illustrating the relationship between various signals labelled in FIGS. 1 and 2.

The operation of the read data paths will be described with reference to FIG. 3 which is a detailed timing diagram illustrating the relationship between various signals labelled in FIGS. 1 and 2. Upon power-up of device 10, one of the first events to occur is the generation of an active power-on reset (POR) signal 60 (shown in FIG. 3). The power on reset signal is typically generated from a power-on reset circuit (shown in block form in FIG. 4) within memory device 10 of FIG. 1. Immediately upon the power-on reset signal becoming a logic high, the internal address counter, shown in FIG. 3, is set to point to the third address location (the address location of the third data bit, i.e., all address bits equal to "0" except bit $A_1$. Note that FIG. 3 shows only the four least significant address bits for convenience.

However, the present invention includes a modified address signal to the memory array, also shown in FIG. 3, which is set to the first memory location, i.e., all address bits $A_{N-A0}$–$A_0$="0", so as to allow sensing the first two data bits upon device power. This can be accomplished by masking address bit $A_1$ of the internal address counter when signal BITZERO is high. However, when signal BITZERO becomes a logic low, address bit $A_1$ is no longer masked and the modified address signal to the array becomes equal to the internal address counter. Accordingly, upon device power-up, the modified address to the memory array is set to point to the first address location ($A_N$–$A_0$="0"). Moreover, since the preferred embodiment of the present invention senses two data bits at a time, address bit $A_0$ is not transferred to the memory array and such address ($A_N$–$A_0$="0") really accesses data at the first two address locations with address bit $A_0$ being used by MUX 34 to selectively and alternatively output data from the two data paths.

Moreover, upon device power-on, the voltage on bitlines 32 and 33 begin to pre-charge to a logic high voltage level, such as 1.5 volts for CMOS-EPROM technology.

Once the power-on reset signal transitions from a logic high to a logic low, as represented by transition 62, but while the delayed power-on reset delay signal (POR_DLY signal 64) is still high, the pre-charge turns off and the first two data bits are sensed. In particular, the selected memory cells corresponding to the first two data bits (bit 0 and bit 1) of the array pull against a weak pull-up device. If the memory cell is on, it will overcome the weak pull-up device and pull the bitline to a logic low voltage level, such as 0 volts. However, if the memory cell is off, the weak pull-up device maintains the bitline voltage at the logic high voltage level. The delay time that signal POR_DLY remains high after signal POR goes low is based upon the time that it takes for the memory cells in the memory array to pull the bitline from a logic high to a logic low. In a preferred embodiment, this time may range from, for example, approximately one-half to one microsecond. One implementation for generating a delayed power on reset signal using a transistor similar to one within the memory cells of memory array 14 is shown in detail in FIG. 4 and described hereinafter. At this point, memory device 10 typically has not yet been selected, i.e., signal NCE is not asserted, and the output of the memory device is in a high impedance state. However, if device power-up occurs with signals NCE and NOE both asserted, the first data bit will be available at the output when signal POR_DLY goes low. In this manner, signal POR_DLY automatically places the device in an un-selected mode until it goes low.

Once the delayed power-on reset signal transitions from a logic high to a logic low as represented by transition 66, the first two data bits sensed by sense amps 40 and 40' are respectively clocked into D flip-flops 42 and 42' and, thus, appear at the outputs of flip-flop 42 and 42'. These logic values are respectively passed through muxes 44 and 44' to the data inputs of D flip-flops 46 and 46' since logic signal BITZERO is a logic high when the first two data bits corresponding to the first two memory locations of the memory array are sensed. Again, memory device 10 has typically not yet been selected, and the output of the memory device is in a high impedance state. Nonetheless, it should be apparent that before any transitions on the clock signal have occurred and even before memory device 10 has been selected by the assertion of logic signal NCE, the read data paths 30 and 31 have pre-charged and sensed the first two data bits of the memory array and have respectively stored these data bits in D flip-flops 42 and 42' as well as supplied them to the data inputs of flip-flops 46 and 46'.

As soon as logic signal NCE is asserted, i.e., the memory device 10 has been selected, as represented by transition 68, logic signals BITZERO and LATCHCLK both transition from a logic high to a logic low voltage level as represented by transitions 70 and 72, respectively. The transition of signal LATCHCLK to a logic low latches the data appearing at the outputs of muxes 44 and 44' (bit 0 and bit 1 as stored in flip-flops 42 and 42') into D flip-flops 46 and 46'. Accordingly, the first two data bits respectively appear at the outputs of flip-flops 46 and 46'. Since the internal address counter is still set to access the third memory location, address logic signal A0 is low and mux 34 passes the output of flip-flop 46 to its output. Thus, the present invention has provided a read data structure that senses and stores the first two data bits upon device power-up, and outputs the first data bit in response to a chip select signal and without the need of a clock signal (CLK).

The transition of signal BITZERO to a logic low now negates the masking of address bit $A_1$ and now the modified address signal is equal to the internal address counter wherein all bits are equal to "0" except bit $A_1$. This now allows the device to begin pre-charging the bitline in preparation for sensing the next two data bits (bit 2 and bit 3) corresponding to the next two memory locations. Moveover, the transition of signal BITZERO to a logic low also causes muxes 44 and 44' to pass the signals appearing at their A0 inputs to their respective outputs. This is now the data path for reading the remaining data bits from the memory array beginning with data bit 2.

Shortly after signal NCE is asserted, clock signal CLK is supplied to device 10. Although the time at which signal CLK is supplied is application specific, signal CLK is typically supplied to device 10 within 100 nanoseconds from when signal NCE is asserted. Upon the first logic low to logic high transition of the clock signal as represented by transition 74, signal LATCHCLK will also transition from a logic low to a logic high, as represented by transition 76. Moreover, transition 74 of signal CLK increments the address counter by one thereby setting address logic bit $A_0$ to be a logic "1". Accordingly, bit 1 is output from the device by mux 34 passing the data appearing at the output of flip-flop 46' to its output.

After transition 76 and during the time that signal LATCHCLK is high, sense amps 40 and 40' sense the voltage levels appearing on bitlines 32 and 33 due to data bits 2 and 3, respectively.

Thus, although only one or two logic transitions have occurred on the signal CLK corresponding to less than one full clock period, two data bits have already been outputted from the memory device 10 as described above. This represents a substantial improvement over the prior art as discussed above which required a minimum of at least three clock transitions before even the first data bit appeared at the output of the read data path. Accordingly, it should be apparent that the present invention is particularly useful when the memory device is used in applications where it must commence outputting data only a short time after being powered-up or selected. Such an application may exist, for example, when the memory device is being used to program a field programmable gate array (FPGA) that requires the memory device to start outputting data to the FPGA within 50 nanoseconds from the device being selected.

After reading bit 2, the frequency of signal LATCHCLK is switched to be one-half that of signal clk. Accordingly, signal LATCHCLK switches logic states only on the rising transition of signal CLK. This effectively allows the memory device to function at twice the previous clock rate. Upon subsequent rising edges of signal CLK, the next two data bits are latched into flip-flops 46 and 46' and data is alternately output from the device from data path 30 or 31 corresponding to the logic value of address bit A0 such that if bit A0 is a logic low then mux 34 passes the data appearing at the output of flip-flop 46 while if bit A0 is a logic high then mux 34 passes the data appearing at the output of flip-flop 46'. In particular, upon the next rising edge of signal CLK as represented by transition 78, signal LATCHCLK switches from a logic high to a logic low as represented by transition 80. This clocks flip flops 46 and 46' and outputs bit 2 from the device.

Also, transition 78 causes the address counter to increment by one and bitlines 32 and 33 begin to pre-charge in preparation for sensing the next two data bits.

Upon the next rising transition of the clock as represented by transition 82, the address counter is incremented, address bit $A_0$="1", and bit 3 is output from the device. Moreover, signal LATCHCLK switches to a logic high, as represented by transition 84, and sense amps 40 and 40' sense data bits 4 and 5 during the time that signal LATCHCLK is high. This process is continued until all of the data is read from the memory device or until the process is interrupted, such as by logic signal NCE going high thereby deselecting the memory device.

Figure 4:
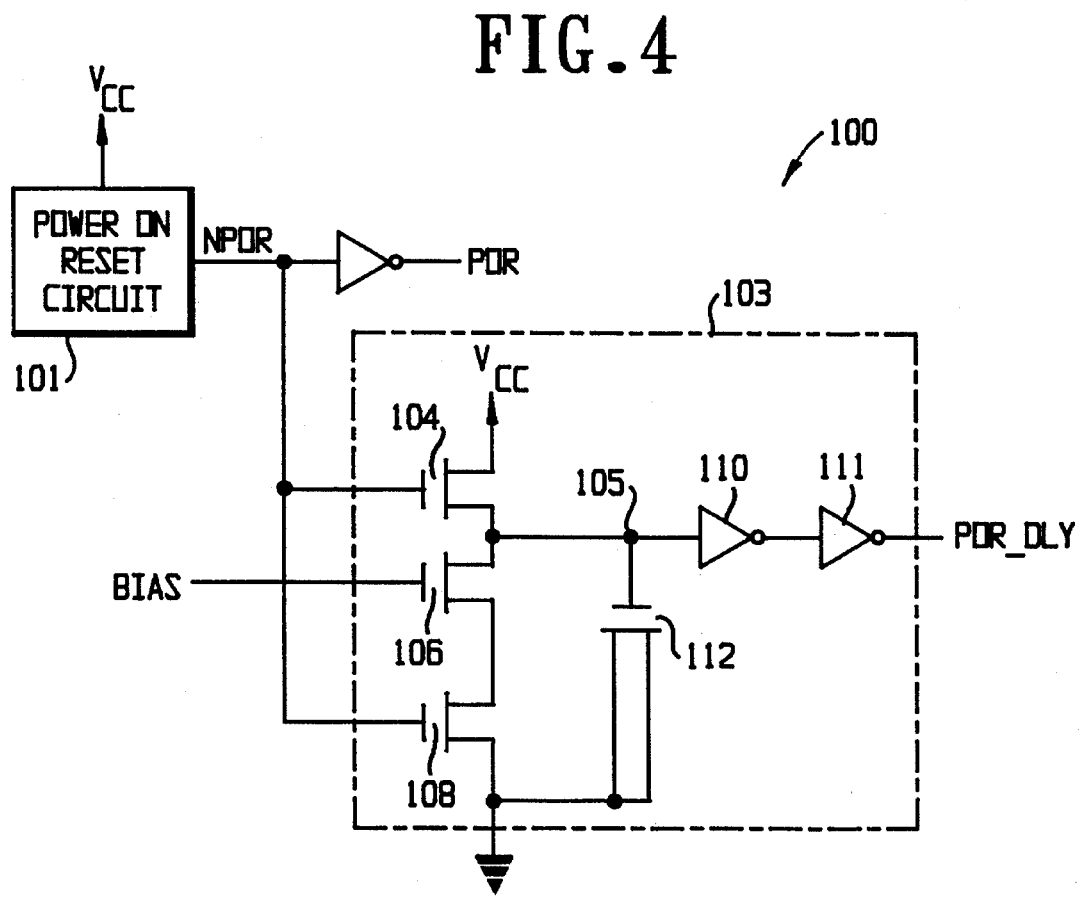
FIG. 4 is a detailed schematic/block diagram illustrating a circuit for generating the delayed power-on reset signal shown in FIGS. 2 and 3.

Referring now to FIG. 4, a detailed schematic/block diagram illustrating circuit 100 for generating the delayed power-on reset signal (POR_DLY) is shown. Circuit 100 is typically fabricated on the same integrated circuit and receives the same power supply voltage as memory device 10, i.e., supply voltage $V_{CC}$. Circuit 100 includes power-on reset circuit 101 for generating a power-on reset (POR) signal that is asserted during the time that the power supply voltage level of the device is below a predetermined threshold and not within a safe operating voltage range.

Briefly, signal POR (power-on reset) is a logic high and complementary signal NPOR (not power-on reset) is a logic low when the power supply voltage level is below the predetermined threshold. However, when the power supply voltage exceeds the predetermined threshold, signal POR transitions from a logic high to a logic low indicating that the received power supply voltage has reached a suitable voltage level for proper device operation.

Circuit 100 also includes delay circuit 103 responsive to signal NPOR for generating a delayed power-on reset signal (POR_DLY). Circuit 103 effectively generates a signal having a high to low transition that occurs after the high to low transition of signal POR by a predetermined amount of time sufficient to allow the first two data bits (bit 0 and bit 1) of the memory array to be sensed by sense amps 40 and 40'.

Delay circuit 103 includes P-channel transistor 104 having a source electrode coupled for receiving the power supply voltage $V_{CC}$ and a drain electrode coupled to the drain electrode of N-channel transistor 106. The source electrode of transistor 106 is coupled to the drain electrode of transistor 108 the latter having a source electrode returned to ground. The gate electrodes of transistors 104 and 108 are coupled to the output of power-on reset circuit 101 for receiving signal NPOR, and the gate electrode of transistor 106 is coupled to receive a bias voltage.

The common drain electrodes of transistors 104 and 106 are coupled through circuit node 105 and to inverters 110 and 111 for providing delayed power-on reset signal POR_DLY. Further, circuit node 105 is coupled to the gate electrode of capacitor/transistor 112 the latter having both drain and source electrodes returned to ground.

As mentioned earlier, the delay time that signal POR_DLY remains high after signal POR goes low is based upon the time that it takes for the memory cells in the memory array to pull their respective bitlines from a logic high to a logic low. A delay time that is too short will not allow sufficient time for the bitlines to be pulled low. On the other hand, a delay time that is too long unduly delays the output of data. Accordingly, delay circuit 103 includes transistor 108 that is similar to the transistors used in the actual memory cells of the memory device so that the time it takes transistor 108 to pull the voltage at circuit node 105 from a logic high to a logic low is related to and closely approximates the time it takes the memory cells within the memory array to pull the bitlines to a logic low. Additionally, to obtain a more accurate time, transistor 106 is similar to a pass transistor used in the read path of the memory array, and capacitor/transistor 112 is chosen to have a capacitance approximately equal to the capacitance seen on the bitlines.

In operation, when signal POR is active (i.e., high), signal NPOR is a logic low which turns on transistor 104 thereby pulling circuit node 105 to a logic high voltage level (voltage $V_{CC}$). This maintains a logic high voltage level for signal POR_DLY via inverters 110 and 111.

However, when signal POR transitions from a logic high to a logic low and is no longer asserted, signal NPOR transitions from a logic low to a logic high thereby turning off transistor 104 and turning on memory cell transistor 108 which starts to pull the voltage at circuit node 105 to a logic low voltage level. Because transistor 108 is similar to those used in the memory cell, the time that it takes for transistor 108 to pull low the voltage appearing at circuit node 105 is related the time that it takes for the cells in the memory array to pull the bitlines low. As a result, circuit node 105 (and signal POR_DLY) is pulled to a logic low in a time that closely approximates the time that it takes for the memory cells to pull the bitlines to a logic low. Accordingly, after the high to low transition of signal POR, signal POR_DLY remains high for a sufficient time to allow the memory cells to pull low the bitlines and to allow the sense amps to adequately sense the data bits, while not unduly delaying the output of data from the memory device.

Although certain preferred embodiments and methods have been disclosed herein, it will be apparent to those skilled in the art from consideration of the foregoing description that variations and modifications of the described embodiments and methods may be made without departing from the true spirit and scope of the invention. Accordingly, it is intended that the invention shall be limited only to the extent required by the appended claims and the rules and principles of applicable law.

I claim:

1. A non-volatile sequential memory device having a read data structure for reading data from a memory array of the device, the memory array including a plurality of memory cells for storing a plurality of data bits, the read data structure including at least one data path for coupling to bitlines of the memory array and comprising:

means for sensing the logic level of data bits appearing on a bitline;

means for latching the data bits sensed; and means for initializing the data path upon power up of the device including means responsive to a power-on reset signal for allowing sensing of the first data bit and means responsive to a delayed power-on reset signal for latching the first data bit before the occurrence and without the need of a clock signal.

2. The non-volatile sequential memory device of claim 1 wherein the means for initializing further includes means for outputting the first data bit immediately upon selection of the device and without the need of a clock signal.

3. The non-volatile sequential memory device of claim 1 wherein a time allowed for sensing the first data bit is based upon the time for a memory cell within the memory array to pull a bitline from a first logic level to a second logic level thereby ensuring that sufficient time is allowed for sensing the first data bit while not unduly delaying output of data from the device.

4. A non-volatile sequential memory device having a read data structure for reading data from a memory array of the device, the memory array including a plurality of memory cells for storing a plurality of data bits, the read data structure comprising:

a first data path coupled to the memory array including means for sensing and storing the first data bit of the memory array upon device power-on;

a second data path coupled to the memory array including means for sensing and storing the second data bit of the memory array upon device power-on; and means coupled to said first and second data paths for selectively and alternately outputting the first and second data bits wherein the first data bit is available for output immediately upon the selection of the device, without need for receipt of a clock signal, and the device begins outputting the first data bit immediately upon being selected.

5. The non-volatile sequential memory device of claim 4 wherein the second data bit is available for output during the first cycle of a received clock signal.

6. The non-volatile sequential memory device of claim 4 wherein the first data path includes:

a sense amp for sensing data bits from the memory array wherein sensing of the first data bit is commenced in response to a transition of a power-on reset signal;

a first latch, coupled to the sense amp, for storing the first data bit in response to a transition of a delayed power-on reset signal;

a multiplexer, responsive to a control signal, for alternately selecting an output from either the sense amp or the first latch; and a second latch, coupled to the multiplexer, for storing data bits in response to a latch signal such that the first data bit is output immediately upon selection of the device and without the occurrence of a received clock signal.

7. The non-volatile sequential memory device of claim 6 wherein the second data path includes:

a sense amp for sensing data bits from the memory array wherein sensing of the second data bit is commenced in response to the transition of the power-on reset signal;

a first latch, coupled to the sense amp of the second data path, for storing the second data bit in response to the transition of the delayed power-on reset signal;

a multiplexer, responsive to the control signal, for alternately selecting an output from either the sense amp of the second data path or the first latch of the second data path; and a second latch, coupled to the multiplexer of the second data path, for storing data bits in response to the latch signal such that the second data bit is output during a first cycle of the received clock signal.

8. The non-volatile sequential memory device of claim 6 wherein a time between the transitions of the power-on reset signal and the delayed power-on reset signal is based upon the time for a memory cell within the memory array to pull a bitline from a first logic level to a second logic level thereby ensuring that sufficient time is allowed for sensing the first and second data bits while not unduly delaying output of data from the device.

9. The non-volatile sequential memory device of claim 6 further including:

a power-on reset circuit for generating the power-on reset signal; and a delay circuit, coupled to the power-on reset circuit, for generating the delayed power-on reset signal, the delay circuit generating a sufficient delay between the transitions of the power-on reset signal and the delayed power-on reset signal to allow the memory cells within the memory array to pull a bitline from a first logic level to a second logic level thereby ensuring that sufficient time is allowed for sensing the first and second data bits while not unduly delaying output of data from the device.

10. The non-volatile sequential memory device of claim 4 further including modified address means for allowing access to the first two data bits upon device power-on.

11. A method for initializing a read pipeline data structure of a sequential memory device having a memory array including a plurality of memory cells for storing a plurality of data bits, the read pipeline data structure including at least one data path coupled to a bitline of the device, the method comprising the steps of:

pre-charging the bitline to a first logic level upon device power-on;

sensing the logic voltage level of a first data bit appearing on the bitline in response to a power-on reset signal;

storing the first data bit in response to a delayed power-on reset signal; and outputting the first data bit from the device in response to a chip enable signal of the device and before the occurrence of a clock signal whereby the device begins outputting data immediately upon being selected.

12. The method of claim 11 wherein a time allowed for sensing the first data bit is based upon the time for a memory cell within the memory array to pull a bitline from a first logic level to a second logic level thereby ensuring that sufficient time is allowed for sensing the first data bit while not unduly delaying output of data from the device.

* * * * *